United States Patent [19]

Blessington et al.

[11] Patent Number: 5,019,675

[45] Date of Patent: May 28, 1991

[54] THICK FILM SUBSTRATE WITH HIGHLY THERMALLY CONDUCTIVE METAL BASE

[75] Inventors: Daniel R. Blessington, Pittsford; Gary A. Kneezel; Michael R. Campanelli, both of Webster, all of N.Y.

[73] Assignee: Xerox Corporation, Stamford, Conn.

[21] Appl. No.: 402,374

[22] Filed: Sep. 5, 1989

[51] Int. Cl.⁵ .................................. H41J 2/05
[52] U.S. Cl. .................................. 346/140 R; 346/75
[58] Field of Search ................... 346/75, 104 PD

[56] References Cited

U.S. PATENT DOCUMENTS 3,613,230 10/1971 Griff .............................. 20/624 R
4,221,925 9/1980 Finey et al. ..................... 174/68.5
4,307,147 12/1981 Ohishi et al. ..................... 428/268
4,601,777 7/1986 Hawkins et al. .................. 156/626
4,786,357 11/1988 Campanelli et al. ..... 346/140 PD X
4,809,428 3/1989 Aden et al. ............. 346/140 PD X Primary Examiner—George H. Miller, Jr.

[57] ABSTRACT

A novel hybrid thick film substrate is enabled by utilizing a highly thermally conductive base metal such as copper. The base metal is passivated by a suitable technique to prevent oxidation. One or more dielectric layers are then screened onto the passivation layer and fired at temperatures upwards of 600° C. The surface of the substrate is then in a condition to accept formation of a conductive pattern or the like.

2 Claims, 1 Drawing Sheet

THICK FILM SUBSTRATE WITH HIGHLY THERMALLY CONDUCTIVE METAL BASE

BACKGROUND AND PRIOR ART STATEMENT

The present invention is directed towards a novel hybrid thick film substrate and, more particulary, to one having a metal base with overlying layers of selectively screened and fired thick film materials to provide necessary electrical properties.

There are numerous electrical circuit designs which require that conductive connections be formed upon a base substrate. In the electrical industry, printed circuit boards are formed on a great variety of base materials, For the most part, the substrates are composed of material with a relatively low thermal conductivity such as epoxy-glass or ceramic. In the fabrication of printheads useful in thermal printing applications, ceramic substrates have been preferred because of their excellent thermal stability, reasonable costs, and good electrical properties. While these properties have proven satisfactory for many applications, they do not provide for optimum electrical and thermal performance for all systems, particularly for the thermal ink jet printing application. For this application, for example, the thermal conductivity requirements are generally more stringent than those afforded by the ceramic class of substrate materials. This is because of the temperature control standard required to maintain a heated and pulsed printhead at the required operating temperature. Another difficulty with the prior art substrates, particularly ceramic, is the difficulty of achieving close dimensional tolerances of the substrate.

The above disadvantages can be overcome by using a metal as the base of the substrate. A metal, for example, copper, is 20 times as conductive as alumina ceramic and enables either maximum cooling or constant elevated (or reduced temperature operation) a condition most desirable for thermal ink jet printing. A metal substrate can be blanked to close tolerances and is cost effective in high volume manufacturing operations. A further advantage of using metal in the substrate is that it can be used as a ground plane and for EMI shielding for those applications requiring such functions.

The problems associated with using metal as a substrate have been the difficulty in overcoating the metal substrate with the thick film layers necessary to enable the electrical components to be mounted on the substrate, and the implementation of suitable passivation techniques to prevent oxidation of the base metal.

There are some prior art examples of metal substrates used for various applications. U.S. Pat. No. 3,613,230 Griff discloses a method for fabricating circuitry which utilizes a pure copper sheet as a base plate with a dielectric layer (such as epoxy), and a copper foil layer laminated on the copper base plate. The copper foil layer is then etched to form a desired pattern and a second dielectric layer and copper foil layer are laminated over the first layer. U.S. Pat. No. 4,307,147 to Ohishi et al. discloses an electrically insulating substrate having good thermal conductivity, the substrate is used for the manufacture of a printed wiring board. The substrate may comprise a highly thermal conductive metal plate, such as aluminum, copper, silver or iron (see Col. 3, lines 28-30). A film composed of a dispersion of metal oxide particles is formed on the metal plate. U.S. Pat. No. 4,221,925 to Finley et al. discloses a printed circuit board having a metal substrate with a fired dielectric layer coated thereon. The resultant coated substrate is then passed through standard metallization processes to form a desired electrical circuit pattern.

While these prior art designs may be satisfactory for the circuits and functions disclosed therein, there are other applications which utilize more complex geometries and have more stringent operating requirements. The present invention is, therefore, directed to a novel hybrid thick film substrate which, in one described embodiment, provides the support for a thermal ink jet printhead. However, the invention is not limited to any such particle application, but is applicable to any system which requires high thermal conductivity and stability afforded by the substrate design of the present invention. More particularly, the invention is directed toward a highly thermally conductive substrate comprising a conductive metal base, a passivation layer overlying said metal base and at least one screened and fired dielectric layer overlying said passivation layer.

IN THE DRAWINGS

DESCRIPTION OF THE INVENTION

Figure 1:
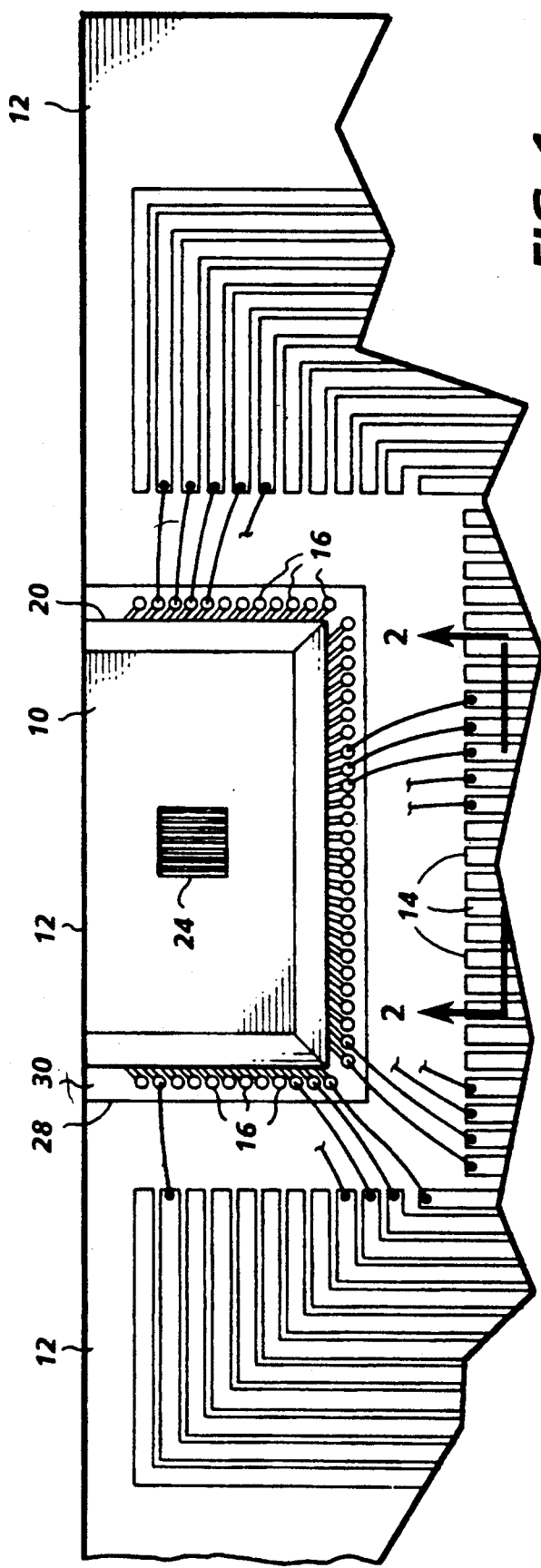
FIG. 1 shows a top view of a printhead used in an ink jet printing application bonded to the substrate of the present invention.

FIG. 1 shows a partial view of a printhead 10 of the type used in a thermal ink jet printer such as that disclosed in U.S. Pat No. 4,601,777 whose contents are hereby incorporated by reference. Printhead 10 is mounted on an electrode board 12 which connects electrodes 14 to electrode 16 of the printhead. Electrodes 16 are connected to individual heating resistors (not shown) within the printhead structure. Referring also to FIG. 1, the printhead comprises an upper substrate 20 which has a plurality of grooves (not shown) formed in a bottom surface thereof. The grooves serve as a channel for ink which is supplied to fill hole 24 by an ink cartridge (not shown). The front end of the grooves form an array of nozzles. A lower electrically insulated substrate 30, has heating resistors and connecting electrodes 16 formed on the top surface. The surface of upper substrate 20 is bonded to lower substrate 30 so that the plurality of resistors (not shown) are positioned within each channel formed by the grooves. The ink at each nozzle forms a meniscus; upon addressing of the individual resistor, current pulses through the resistor to vaporize the ink to produce a temporary vapor bubble which expels droplets of ink onto an adjacent recording member.

Figure 2:
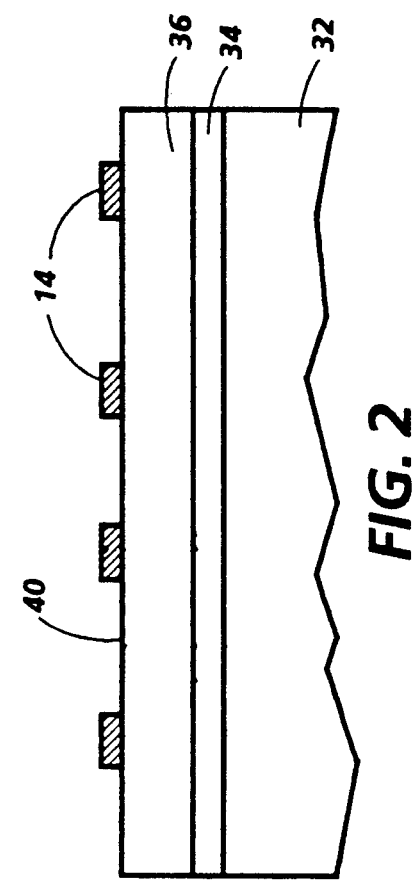
FIG. 2 shows a cross-sectional view of the substrate drawn through line 2—2 of FIG. 1.

Referring now to FIG. 2, there is shown a cross-sectional view of substrate 12 taken through line 2—2 of FIG. 1. In a preferred embodiment substrate 12 comprises a copper bases 32. Base 32 is silver plated to form layer 34 which serves to protect the copper from oxidation of subsequent high temperature thick film processing. Other metals (such as nickel) may be plated prior to the silver in order to prevent copper from coming to the surface during high temperature processing. Dielectric layer 36 is formed on layer 34 by one or more screening depositions, and fired at temperatures of approximately 600° centigrade or higher. Suitable photoresist techniques are used to leave exposed areas which will be required for bonding of the thermal ink jet device and for thermal communication path between lower surface 12 and layer 34. A conductive pattern is then printed on surface 40 to form the electrode 14.

The fabrication techniques discussed above can be extended to fabricate a wide variety of thick film circuits. Any metal that can withstand the processing temperatures may be suitable for use as a substrate material. Multiple layers of dielectrics, resistors and conductors may comprise the thick film circuit. Suitable passivation techniques to preclude oxidation include electroplating, electroless plating, and vacuum deposition of other metals. Alternatively, deposition of passive dielectrics could achieve oxidation resistance nd electrical insulation in one processing step. Another approach to preventing oxidation of the substrate metal at thick film processing temperatures is firing the thick films in an inert or reducing atmosphere. This is commonly used in the industry t fire non noble inks such as copper.

While the invention has been described with reference to the structure disclosed, it is not confined to the specific details set forth, but is intended to cover such modifications or changes as may come within the scope of the following claims.

We claim:

1. In a thermal ink jet printer, a printhead adapted to heat ink contained within ink channels formed within the printhead by applying electrical signals to heater resistors formed within said ink channels, said electrical signals applied applied along a resistor electrode pattern connected between said resistors and an electrical input source via an intermediate electrode board substrate, said electrode board substrate, including a thermally conductive substrate comprising a conductive metal base, a passivation layer overlying said metal base, at least one screened and fired dielectric layer overlying said passivation layer and an electrode pattern printed on the upper surface, said substrate electrode pattern electrically connected to said resistor electrode pattern.

2. The printer of claim 2 wherein said metal base is copper and said passivation layer is silver deposited by an electroplating process.

* * * * *